United States Patent [19]

Dutt et al.

[11] Patent Number: 5,026,660
[45] Date of Patent: Jun. 25, 1991

[54] METHODS FOR MAKING PHOTODECTORS

[75] Inventors: Bulusu V. Dutt, Yorktown Heights, N.Y.; Peter G. Abbott, Greenwich, Conn.

[73] Assignee: Codenoll Technology Corporation, New York, N.Y.

[21] Appl. No.: 403,545

[22] Filed: Sep. 6, 1989

[51] Int. Cl.$^5$ ............... H01L 21/00; H01L 31/18
[52] U.S. Cl. .................. 437/80; 148/DIG. 102; 148/DIG. 143; 437/3; 437/187; 437/924
[58] Field of Search .......... 148/DIG. 26, 72, 56, 148/65, 102, 104, 120, 143, 153, 172; 357/16, 30 B, 30 E, 30 J, 30 H, 30 Q, 30 R, 56; 437/2-5, 36, 88, 81, 105, 107, 126, 133, 187, 916, 924, 948, 984

[56] References Cited

U.S. PATENT DOCUMENTS

| | | | |
|---|---|---|---|
| 3,382,115 | 5/1968 | Carter et al. | 437/80 |
| 3,928,094 | 12/1975 | Angell | 437/80 |
| 3,969,746 | 7/1976 | Kendall et al. | 357/30 |
| 4,021,276 | 5/1977 | Cho et al. | 437/80 |
| 4,282,541 | 8/1981 | Tsang | 357/30 |
| 4,335,503 | 6/1982 | Evans, Jr. et al. | 437/80 |
| 4,514,582 | 4/1985 | Tiedje et al. | 357/30 |
| 4,547,958 | 10/1985 | Hafford | 437/2 |
| 4,910,166 | 3/1990 | Dholakia | 437/80 |

FOREIGN PATENT DOCUMENTS 0155130 9/1984 Japan .

Primary Examiner—Olik Chaudhuri
Assistant Examiner—William Bunch
Attorney, Agent, or Firm—Pennie & Edmonds

[57] ABSTRACT

A shadow-masking process for manufacturing low dark current photodetectors with low noise characteristics is disclosed. The process includes shadow-masking a semiconductor wafer by positioning a patterned shadow-mask on a surface of the wafer. The shadow-mask is patterned with, for example, circular openings or stripe openings. Layers, such as metallization layers to form metallic contacts or anti-reflection layers are deposited onto the wafer through the patterned openings in the shadow-masks. This shadow-masking process may be used in the production of any semiconductor device requiring patterned layers.

6 Claims, 4 Drawing Sheets

METHODS FOR MAKING PHOTODECTORS

FIELD OF THE INVENTION

This invention relates generally to semiconductors and, more particularly, to a shadow-masking process for manufacturing low dark current photodetectors with low noise characteristics.

BACKGROUND OF THE INVENTION

Photodetectors convert optical signals to electrical signals. More specifically, photodetectors absorb incident photons which produce electrical charge carriers. The flow of these charge carriers produces current.

Photodetectors are widely used in fiber optic communications. Photodetectors which have very low dark currents, i.e., low current flow in the absence of light, generally exhibit high signal-to-noise (s/n) ratios and, accordingly, are very desirable for use in fiber optic systems. Generally, such photodetectors are diodes having a P-I-N structure (PIN's), i.e., diodes in which the p and n regions are separated by a high-resistivity intrinsic layer, or more elaborate avalanche photodiodes (APD's).

The wavelength range of the photons used in fiber optic communications is on the order of 0.8 $\mu$m to 1.6 $\mu$m, although longer or shorter wavelengths may be used. Wafers comprising epitaxial structures grown on InP substrates are typically used in constructing photodetectors in the 1.3 $\mu$m to 1.6 $\mu$m wavelength range. These photodetectors include one or more layers of InP, InGaAs and InGaAsP compositions which are lattice matched to the underlying InP substrate, i.e., the structural arrangement of the atoms of these layers is the same as the structural arrangement of the atoms of the InP substrate. Generally, the wafers are processed into finished photodetectors using elaborate steps consisting of full-surface layering, i.e., full-surface diffusion, full-surface metallization, full-surface anti-reflection coating, and several steps of photolithography to pattern appropriate features into these full-surface metallic or dielectric layers in order to form the device. The patterns are formed by a photoresist lift-off technique or etched into the previously deposited full-surface layers by using toxic and corrosive acid mixtures or by organic solvents.

Photodetectors typically include two ohmic contacts such as a metallic n-contact on one side of the device and a metallic p-contact on the other side of the device. Accordingly, full-surface metallization followed by photolithographic patterning is conventionally used on both sides of the photodetector to form these contacts.

Furthermore, at least one side of the device must permit entry of light or radiation into the photodetector so as to enable detection thereof. Thus, an appropriate anti-reflection coating is deposited in the light or radiation entry area of the photodetector to improve the photoresponse of the photodetector to the incoming light. A full-surface anti-reflection coating is conventionally used and, again, photolithographic patterning must follow.

Unfortunately, full-surface layering is extremely inefficient and time-consuming. Separate steps of photolithography are employed to pattern appropriate features into each deposited full layer. These steps of photolithography generally follow each step of full-surface layering. Accordingly, each step of full-surface diffusion, full-surface metallization and full-surface anti-reflection coating requires a subsequent step of photolithographic patterning of each full-surface layer; the pattern being appropriate for a given photodetector design. A significant amount of time is required to perform the semiconductor processing steps of deposition, sputtering, etching, etc. required to form the photodetector.

The above-described process is conventionally utilized in the manufacture of semiconductor devices such as photodetectors and generally results in a low yield (10%-20%) of low dark current, low noise and high breakdown voltage photodetectors. Additionally, this process involves undesirable requirements such as the need for full-surface layering throughout the manufacturing steps. This results in excessive processing durations, for example, seven to ten days. In sum, the conventional process is inefficient and results in high cost semiconductor photodetectors.

SUMMARY OF THE INVENTION

In one embodiment of the invention, InGaAs is grown on one side of an InP:Sn substrate to form a semiconductor wafer. Zn is diffused into a portion of the InGaAs side of the wafer thereby forming a wafer portion having a first conductivity type; the InP:Sn substrate being of opposite conductivity type. Illustratively, the InGaAs side is the p-side of the wafer while the InP:Sn substrate is the n-side of the wafer. The wafer is thinned-down to an appropriate thickness for a given semiconductor photodetector design, and a shadow-masking technique is then utilized to deposit metallization layers and an anti-reflection coating on the wafer. The metallization layers and the anti-reflection coating are patterned in accordance with the specific shadow-mask employed.

Illustratively, shadow-masking employs the use of a shadow-mask positioned on a surface of a wafer. In the presently preferred embodiment, two shadow-masks are employed simultaneously; one mask is positioned on each of two sides of the wafer. Thus, layers may be deposited on each side of the wafer simultaneously. Alternatively, a single layer may be deposited on one side of the wafer, with the other side of the wafer either not being exposed to the material to be deposited or being fully covered by a mask having no openings therethrough.

More specifically, one shadow-mask having generally circular openings therethrough is positioned on the p-side of the wafer and another shadow-mask having generally stripe-openings and opaque-regions separating the stripe-openings is positioned on the n-side of the wafer. The shadow-masks are preferably constructed from metal and are appropriately patterned for a given semiconductor photodetector design. The nature of the alignment of the shadow-masks depends on whether the metallization layers are being deposited on the wafer or the anti-reflection coating is being deposited on the wafer.

In one embodiment, a <100>-oriented wafer (referring to the direction of the axes of the substrate lattice relative to the surfaces of the substrate) with <110> edges is utilized. To deposit patterned metallization layers on each side of the wafer, two shadow-masks are initially positioned on opposite sides of the wafer such that one of the <110> edges of the <100>-oriented wafer is lined up with the stripe-openings. The shadow-masks are positioned such that the circular openings of a first shadow-mask on the p-side of the wafer are not opposite the stripe-openings of a second shadow-mask on the n-side of the wafer. Once the shadow-masks are properly positioned, metallization layers may be deposited by conventional techniques, such as through evaporation in a thermal evaporator.

Next, a patterned anti-reflection coating is deposited on the wafer. Specifically, the second shadow-mask having stripe-openings and positioned on the n-side of the wafer is replaced with a third shadow-mask having stripe-openings complementary to the stripe-openings of the second shadow-mask, i.e., the third shadow-mask has stripe-openings at the regions that the second shadow-mask did not have stripe-openings. As a result, the shadow-masks are positioned on opposite sides of the wafer such that the circular openings of the first shadow-mask on the p-side of the wafer are opposite the stripe-openings of the third shadow-mask on the n-side of the wafer. A patterned anti-reflection coating is then deposited on the n-side of the wafer between the patterned metallization layer previously deposited on the n-side of the wafer; and the shadow-masks are then removed. In this embodiment, nothing further is deposited onto the p-side or n-side of the wafer, although additional deposition onto the p-side or n-side may be required for other embodiments.

Proper alignment of the wafer with the two shadow-masks each positioned on opposite sides of the wafer as described above is maintained by a mechanical fixture which comprises a fixture cover and a fixture base. The fixture base is provided with alignment pins which are first inserted through alignment holes existing in the shadow-masks and then through alignment holes existing in the fixture cover. The wafer is "sandwiched" and held in proper position by the application of suitable force between the fixture cover and fixture base.

The fixture cover and fixture base each has an opening or window through which layers may be deposited onto the wafer in accordance with the pattern of the shadow-masks. Generally, deposition is accomplished through evaporation in a thermal evaporator.

After the patterned metallization layers and patterned anti-reflection coating are deposited onto the wafer and the shadow-masks are removed, the wafer is processed photolithographically. Illustratively, the wafer is subjected to one step of photolithography on the p-side using negative photoresists. Selective etching is then used to form mesas at proper locations on the wafer. Subsequently, the negative photoresists are removed. The wafer is then scribed and cleaved to obtain individual semiconductor photodetectors which are attached to ceramic-carriers or to metal packages of the type referred to in the art as TO-Can and bonded thereto. The steps of bonding and testing for performance and reliability remain the same as for conventional photolithographically produced devices.

Advantageously, the entire process for manufacturing photodetectors takes approximately two days instead of seven to ten days as in conventional processes for manufacturing photodetectors. In addition, yields have been achieved of 50% to 80% instead of 10% to 20%.

Accordingly, it is a principal object of the invention to provide new and improved semiconductor devices and methods of making same.

Another object of the invention is to provide a more efficient method of manufacturing semiconductor photodetectors resulting in a high yield of usable devices.

Another object of the invention is to provide a faster method of manufacturing semiconductor photodetectors.

Another object of the invention is to provide a less-expensive method of manufacturing semiconductor photodetectors.

BRIEF DESCRIPTION OF THE DRAWINGS

These and other objects, features and advantages of the invention will be more readily apparent from the following detailed description of the preferred embodiment in which.

DETAILED DESCRIPTION OF PREFERRED EMBODIMENT

The present invention involves a shadow-masking process for producing semiconductor devices such as photodetectors. In a preferred embodiment, two shadow-masks having metallization patterns thereon for a given photodetector design are positioned on opposite sides of the wafer, and appropriate metallization layers are deposited through the patterns of the shadow-masks. One of the two shadow-masks is then replaced with another shadow-mask patterned with appropriate anti-reflection coating patterns for a given photodetector design, and an appropriate antireflection coating layer is deposited through the pattern of this shadow-mask.

Figure 1:
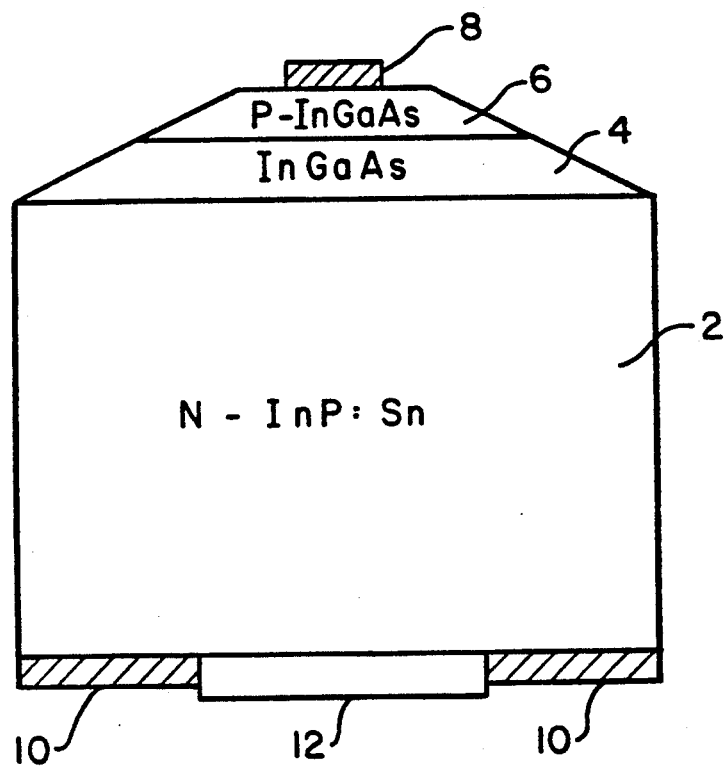
FIG. 1 is a cross-sectional view of a photodetector constructed in accordance with this invention.

Referring initially to FIG. 1, there is depicted a cross-sectional view (not necessarily to scale) of a completed photodetector constructed in accordance with this invention. The device comprises an n-type substrate layer 2, an absorptive layer 4, a p-type layer 6, a p-contact 8, n-contacts 10, and a light or radiation entry area covered by an anti-reflection coating 12.

Preferably, for a photodetector to be used in the 1.3 $\mu$m to 1.6 $\mu$m wavelength range, n-type substrate layer 2 is a $<100>$-oriented wafer with $<110>$ edges composed of InP doped with Sn. Absorptive layer 4 comprises InGaAs, and p-type layer 6 comprises InGaAs into which Zn has been diffused. P-contact 8 comprises separate chromium and gold layers, n-contacts 10 comprise a layer of gold, germanium, and nickel, and the anti-reflection coating 12 comprises silicon oxide.

In a preferred embodiment, the semiconductor wafer of the photodetector depicted in FIG. 1 is formed as follows. The process starts with the selection of a low dislocation density InP:Sn $<100>$-oriented substrate 2 with $<110>$ edges; one side of this substrate forms the n-side of the wafer. The concentration of Sn doped into the substrate is illustratively between $1 \times 10^{18}$ Cm$^{-3}$ (carriers per cubic meter) and $3 \times 10^{18}$ Cm$^{-3}$ thickness of substrate 2 is illustratively between 350 $\mu$m and 380 $\mu$m. Layer 4 of InGaAs is grown by liquid phase epitaxy on one major side of the <100>-oriented InP:Sn substrate. This layer has a residual, i.e., unintentional doping, carrier concentration of illustratively $5 \times 10^{14}$ $Cm^{-3}$ to $5 \times 10^{15}$ $Cm^{-3}$. The thickness of the InGaAs layer is illustratively on the order of 3 μm.

Next, Zn is diffused into the InGaAs layer of the wafer to a depth of illustratively between 1 μm and 2 μm forming p-type layer 6. Preferably, the Zn diffusion is carried out in a sealed quartz ampoule with a $ZnAs_2$ source.

The wafer is then thinned-down from the substrate side to a thickness appropriate for a given photodetector device, illustratively between 75 μm and 100 μm in the preferred embodiment. A conventional method of thinning using polishing steps and a bromine-methanol solution may be utilized to thin-down the n-side of the wafer.

Next, p-contact and n-contact patterned metallization layers are deposited on the wafer. This is accomplished using shadow-masks depicted in FIG. 2 and the shadow-masking technique illustrated in FIG. 3.

Figure 2:
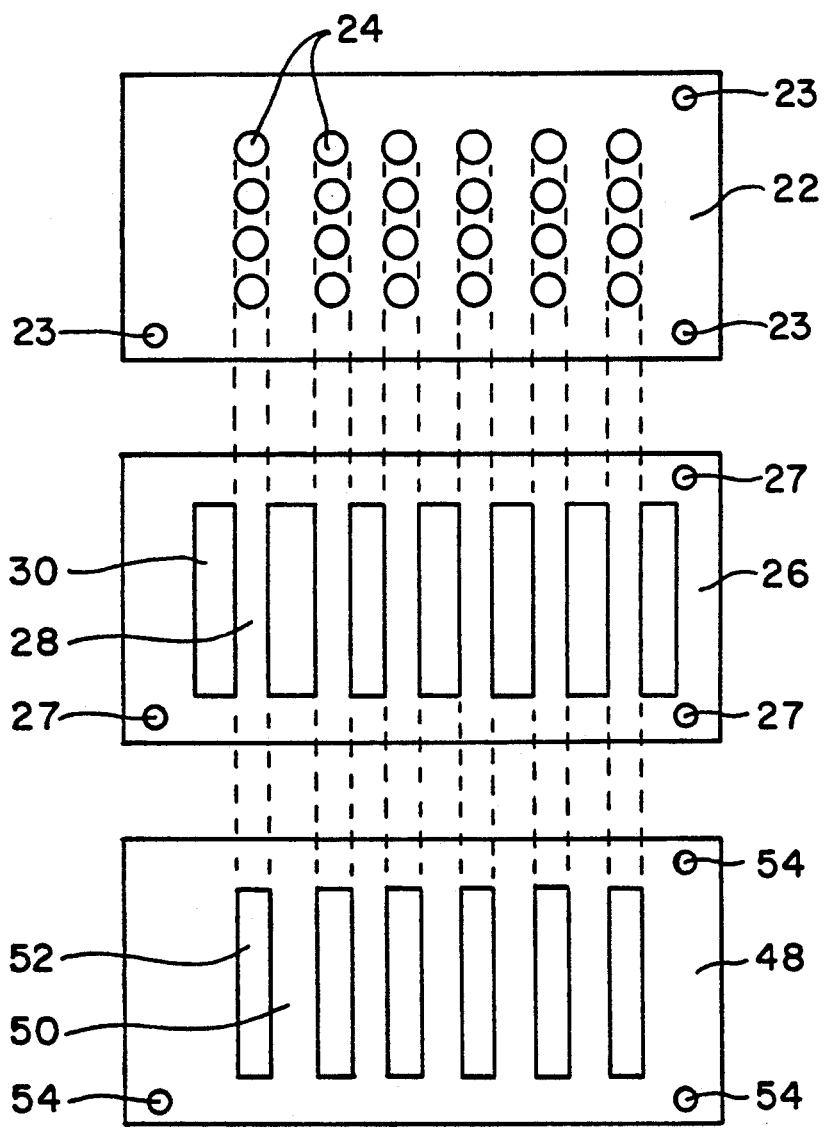
FIG. 2 depicts a set of shadow-masks suitable for manufacturing the photodetector depicted in FIG. 1.

Referring to FIG. 2, there are depicted shadow-mask 22 for forming a p-contact, shadow-mask 26 for forming n-contacts and shadow-mask 48 for forming an anti-reflection coating. Like the photodetector of FIG. 1, the masks of FIG. 2 are not necessarily drawn to scale. Illustratively, the shadow-masks of FIG. 2 depict patterns for forming twenty-four photodetectors; but the modification of the masks to form other numbers of photodetectors will be evident from the present description. Shadow-mask 22 is provided with alignment holes 23 and circular openings 24; shadow-mask 26 is provided with alignment holes 27, stripe-openings 30, and opaque-regions 28 separating the stripe-openings 30; and shadow-mask 48 is provided with alignment holes 54, stripe-openings 52, and opaque-regions 50 separating the stripe-openings 52. When the masks are superimposed and aligned by means of alignment holes 23, 27, 54, the circular openings 24 of shadow-mask 22 are directly over opaque regions 28 of shadow-mask 26, and stripe-openings 52 of shadow-mask 48.

The shadow-masks are of Cu-Ni bimetallic structure and illustratively have a thickness of between 100 μm and 150 μm. Advantageously, such a thickness enables deposition of patterns having clearly defined boundaries. The diameter of the circular openings 24 of shadow-mask 22 are illustratively between 50 μm and 80 μm, and the stripe-openings 30 are of an appropriate width for the given photodetector design, illustratively between 200 μm and 250 μm.

Figure 3:
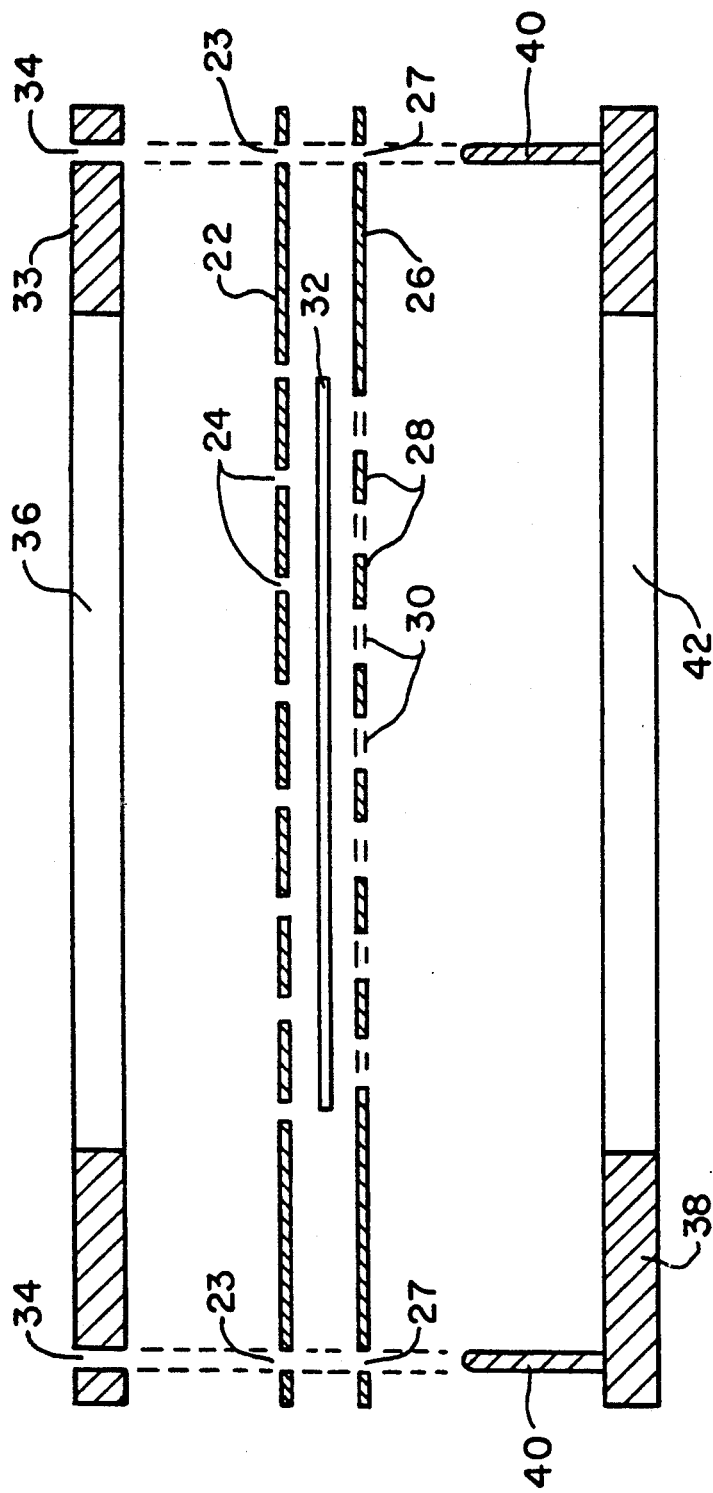
FIG. 3 is a cross-sectional view depicting the positioning and alignment of shadow-masks for the deposition of patterned metallization layers on the wafer, and the method by which the shadow-masks and wafer are held in proper alignment.

Referring now to FIG. 3, the position of shadow-mask 22 having circular openings 24 and alignment holes 23 and the position of shadow-mask 26 having stripe-openings 30 and alignment holes 27 are depicted relative to a semiconductor wafer 32. Wafer 32 illustratively has been fabricated as described in conjunction with FIG. 1 by using an InP wafer doped with Sn to form an n-type region, growing a layer of InGaAs on one major face of the wafer and diffusing Zn into the InGaAs layer to form a p-type region. Wafer 32 is oriented such that the p-side faces shadow-mask 22. At the same time, shadow-mask 26 having stripe-openings 30, opaque-regions 28 separating the stripe-openings, and alignment holes 27 is positioned on the n-side of wafer 32, such that the n-side faces shadow-mask 26.

For depositing metallization layers, the shadow-masks are positioned such that one of the cleaved <110> edges of the <100>-oriented wafer aligns with the opaque-regions. Proper alignment can be accomplished, for example, while viewing through a stereo-microscope of 10×-20× magnification range.

As illustrated in FIG. 3, proper positioning and alignment of shadow-mask 22, shadow-mask 26, and wafer 32 is maintained by a mechanical fixture comprising a fixture cover 33 having alignment holes 34 and an opening or window 36 through which deposition material may pass, and a fixture base 38 having alignment pins 40 and an opening or window 42 through which deposition material may pass. Illustratively, there are three alignment holes in each mask. With wafer 32 "sandwiched" between shadow-mask 22 and shadow-mask 26, alignment pins 40 of fixture base 38 are inserted, as far as possible, through alignment holes 27 of shadow-mask 26, through alignment holes 23 of shadow-mask 22, and through alignment holes 34 of fixture cover 33. As a result, the two shadow-masks are aligned as shown in FIG. 2 so that circular openings 24 are opposite opaque regions 28.

Next, metallization patterns are deposited on the wafer. Illustratively, chromium and gold layers are deposited on the p-side of wafer 32 through circular openings 24 to form a p-contact. A gold, germanium and nickel layer is deposited on the n-side of wafer 32 through stripe openings 30 to form the n-contacts. Generally, deposition is accomplished through evaporation in a thermal evaporator by conventional methods.

More specifically, the mechanical fixture is loaded with the p-side of wafer 32 facing downwards in a thermal evaporator. A receptacle containing the necessary chromium is also loaded into the evaporator. The chromium is evaporated through circular openings 24 of shadow-mask 22 onto the p-side of wafer 32 to a thickness of illustratively between 300Å and 500Å. After the chromium is deposited, the receptacle is loaded with gold which is then evaporated over the chromium layer to a thickness of illustratively between 3000Å and 5000Å. Next, the mechanical fixture is turned upside-down in the thermal evaporator so that the n-side of wafer 32 is facing downwards; and the receptacle is loaded with gold, germanium and nickel which are evaporated through the stripe openings 30 of shadow-mask 26 onto the n-side of wafer 32.

Subsequently, an anti-reflection coating is deposited on the n-side of wafer 32. This deposition is accomplished using the shadow-masking arrangement depicted in FIG. 4. Shadow mask 22 having circular openings 24 and alignment holes 23 may remain positioned on the p-side of semiconductor wafer 32. However, shadow-mask 26 (FIG. 3) is replaced by shadow-mask 48 with stripe-openings 52, opaque-regions 50 separating the stripe-openings and alignment holes 54. As is apparent from FIG. 2, shadow-mask 48 has stripe-openings 52 at the regions where shadow-mask 26 (FIG. 3) had opaque-regions 28, and has opaque-regions 50 at the regions where shadow-mask 26 had stripe-openings 30. For deposition of anti-reflection coating patterns, shadow-mask 48 is positioned on the n-side of wafer 32 such that stripe-openings 52 are aligned with circular openings 24 of shadow-mask 22, i.e., opaque-regions 50 are aligned so as to cover the metallic n-contact patterns which were previously deposited onto the n-side of wafer 32. Thus, anti-reflection coating patterns can be deposited on the n-side of wafer 32 between the metallic n-contact patterns previously deposited.

Figure 4:
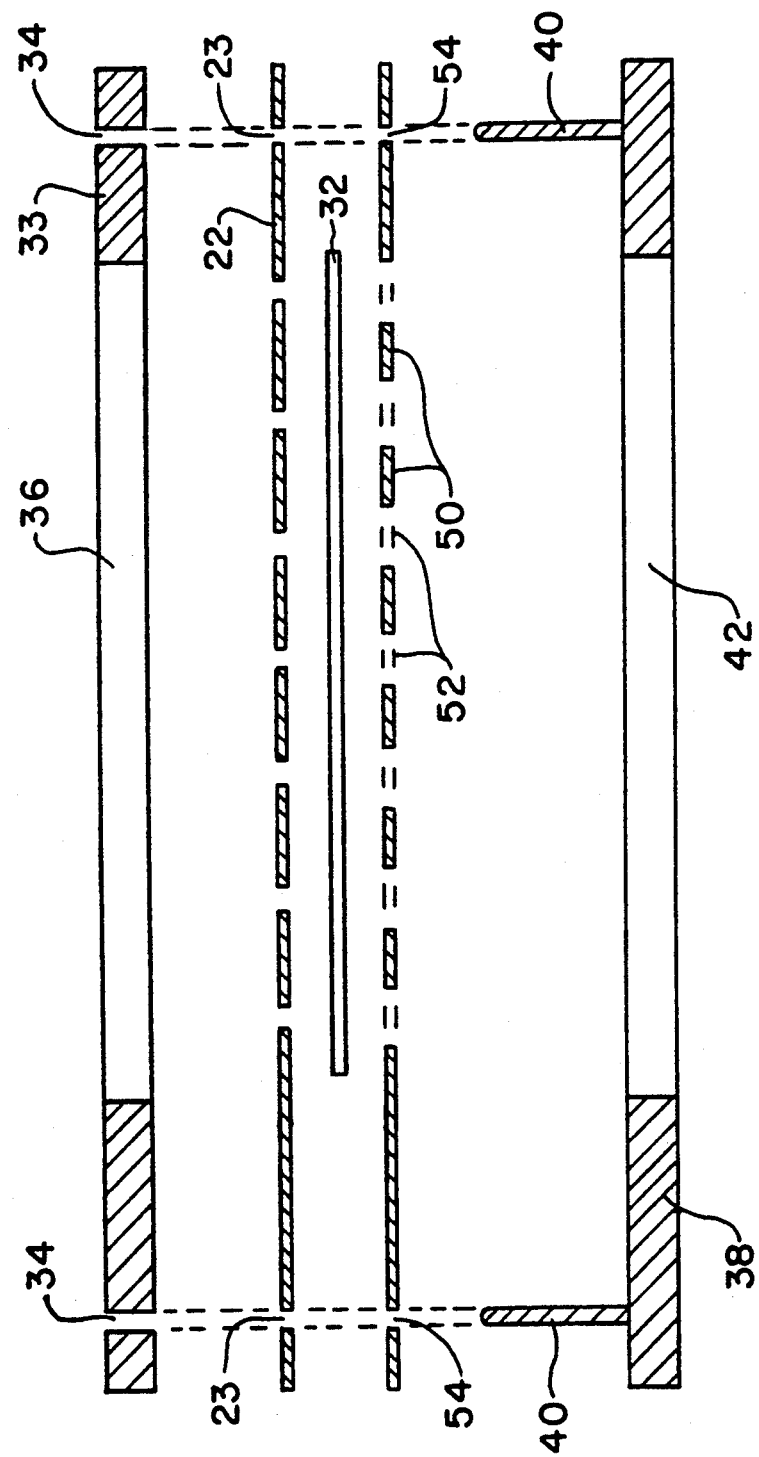
FIG. 4 is a cross-sectional view depicting the positioning and alignment of shadow-masks for the deposition of a patterned anti-reflection coating on the wafer, and the method by which the shadow-masks and wafer are held in proper alignment.

Proper positioning and alignment of the shadow-masks and wafer are maintained, as illustrated in FIG. 4, using the same mechanical fixture illustrated in FIG. 3 and described above. In particular, the alignment pins cause the masks 22 and 48 to be aligned as shown in FIG. 2.

An anti-reflection coating is now deposited on the n-side of wafer 32. The mechanical fixture is loaded with the n-side of wafer 32 facing downwards into the thermal evaporator; and a receptacle containing a suitable anti-reflection coating, illustratively SiO, is also loaded. The anti-reflection coating is evaporated through stripe-openings 52 of shadow-mask 48 onto the n-side of wafer 32 between the stripes of the metallic n-contact pattern previously deposited. The mechanical fixture is then disassembled and the shadow-masks and wafer are removed.

Next, individual mesa devices, as depicted in FIG. 1, are formed from the wafer. Mesas are formed to reduce capacitance. Generally, mesa devices are produced by subjecting a diffused surface of a semiconductor wafer to photolithography, etching down all but selected areas of this surface to form physical plateaus or mesas, and obtaining individual mesa devices by scribing and cleaving the wafer.

Illustratively, wafer 32 with the shadow-mask patterned Cr-Au layers on the diffused p-side, the Au-Ge-Ni layer on the n-side, and the anti-reflection coating between the patterned Au-Ge-Ni stripes on the n-side is subjected to one step of photolithography on the p-side to form the mesas. The type of photolithography used to form the mesas employs a negative photoresist, illustratively SC-180 marketed by Hunt Chemicals or an equivalent thereof. The negative photoresist is applied on the p-side of the wafer and appropriately developed using conventional methods. Selective etching, also by conventional methods, is then used to form the mesas at proper locations of the wafer, and the negative photoresist is removed.

Subsequently, the wafer is scribed and cleaved to obtain individual mesa devices or, in this case, individual photodetectors. These photodetectors are attached to ceramic-carriers or to metal packages of the type referred to in the art as TO-Can and bonded thereto. The steps of bonding and testing for performance and reliability remain the same as for conventional photolithographically processed devices.

Thus, a new and improved, more efficient, faster and less-expensive method for manufacturing semiconductor devices such as photodetectors is provided. The entire process described takes approximately 1-2 days in contrast to 7-10 days for conventional processing, and the yields of usable devices are generally 50%-80% as compared to 10%-20% in conventional processing.

While the invention has been described in conjunction with specific embodiments relating to photodetectors, it is evident in light of the foregoing description that numerous alternatives, modifications, and variations will be apparent to those skilled in the art. For example, the teachings herein may be employed to form other semiconductor devices in which patterned layers and the like are employed. The dimensions, thicknesses, diameters, ranges and the like set forth herein are illustrative and adequate for practicing the invention, however, different dimensions, thicknesses, diameters, ranges, etc. may be used and are within the spirit and scope of the appended claims.

What is claimed is:

1. A method of manufacturing a photodetector of the type having metallization contacts and an anti-reflection coating deposited on a semiconductor wafer wherein the improvement comprises the steps of shadow-masking said semiconductor wafer by positioning patterned shadow-masks on said wafer and depositing patterned layers therethrough, wherein a patterned metallization layer is deposited through a patterned shadow-mask onto each of two opposite sides of said semiconductor wafer to form two metallic contacts, and a patterned anti-reflection coating is deposited through another patterned shadow-mask onto one side of said semiconductor wafer and adjacent to one of said patterned metallization layers.

2. The method of claim 1 wherein alignment of said shadow-masks on said wafer is maintained by a fixture cover having alignment holes and a mating fixture base having alignment pins for mating with alignment holes in said shadow-masks and with said alignment holes in said fixture cover.

3. A method of manufacturing a photodetector of the type having a semiconductor wafer, metallization layers and an anti-reflection coating comprising the steps of:
    shadow-masking said semiconductor wafer by positioning on said wafer shadow-masks suitable for depositing metallization layers, said shadow-masks having appropriate metallization contact patterning and being properly positioned and aligned for a given photodetector design;
    depositing a metallization layer through the shadow-mask thereby forming a patterned metallization layer on said wafer;
    shadow-masking said semiconductor wafer by positioning on said wafer a shadow-mask suitable for depositing an anti-reflection coating, said shadow-mask having appropriate anti-reflection coating patterning and being properly positioned and aligned for a given photodetector design; and
    depositing an anti-reflection coating through the shadow-mask thereby forming a patterned anti-reflection coating layer on said wafer.

4. The method of claim 3 wherein alignment of said shadow-masks on said wafer is maintained by a fixture cover having alignment holes and a mating fixture base having alignment pins for mating with alignment holes in said shadow-masks and with said alignment holes in said fixture cover.

5. A method of manufacturing a photodetector comprising the steps of:
    forming a substrate doped so as to have a first conductivity type;
    forming an absorptive layer on said substrate;
    doping said absorptive layer to a desired depth so as to form a layer having a second conductivity type;
    positioning a first shadow-mask on said layer having a second conductivity type, said first shadow-mask being patterned to form a first contact;
    positioning a second shadow-mask on a surface of said substrate opposite said absorptive layer, said second shadow-mask being patterned to form a second contact;
    depositing a first metallization layer through said first shadow-mask so as to form a first electrical contact;
    depositing a second metallization layer through said second shadow-mask so as to form a second electrical contact;
    replacing said second shadow-mask with a third shadow-mask, said third shadow-mask being patterned to form an anti-reflection coating; and depositing an anti-reflection coating through said third shadow-mask so as to form an anti-reflection coating through which light may pass.

6. The method of claim 5 wherein alignment of said shadow-masks on said wafer is maintained by a fixture cover having alignment holes and a mating fixture base having alignment pins for mating with alignment holes in said shadow-masks and with said alignment holes in said fixture cover.

* * * * *